United States Patent
Park et al.

(10) Patent No.: US 12,154,815 B2
(45) Date of Patent: Nov. 26, 2024

(54) STACK FOR MANUFACTURING FLEXIBLE ELEMENT AND METHOD FOR MANUFACTURING FLEXIBLE ELEMENT BY USING SAME

(71) Applicant: LG CHEM, LTD., Seoul (KR)

(72) Inventors: Chae Won Park, Daejeon (KR); Jinho Lee, Daejeon (KR); Chan Hyo Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 869 days.

(21) Appl. No.: 17/260,694

(22) PCT Filed: Nov. 19, 2019

(86) PCT No.: PCT/KR2019/015868
§ 371 (c)(1),
(2) Date: Jan. 15, 2021

(87) PCT Pub. No.: WO2020/106029
PCT Pub. Date: May 28, 2020

(65) Prior Publication Data
US 2021/0313214 A1    Oct. 7, 2021

(30) Foreign Application Priority Data

Nov. 20, 2018 (KR) .................. 10-2018-0143385
Nov. 14, 2019 (KR) .................. 10-2019-0145547

(51) Int. Cl.
| | | |
|---|---|---|
| H01L 21/683 | (2006.01) | |
| B29C 41/02 | (2006.01) | |
| B29C 41/42 | (2006.01) | |
| B29K 79/00 | (2006.01) | |
| B29L 31/34 | (2006.01) | |
| C09D 179/08 | (2006.01) | |
| H01L 27/12 | (2006.01) | |

(52) U.S. Cl.
CPC .......... *H01L 21/6835* (2013.01); *B29C 41/02* (2013.01); *B29C 41/42* (2013.01); *C09D 179/08* (2013.01); *B29K 2079/08* (2013.01); *B29L 2031/3475* (2013.01); *H01L 27/1266* (2013.01); *H01L 2221/68386* (2013.01)

(58) Field of Classification Search
CPC ............ H01L 21/6835; H01L 27/1266; H01L 2221/68386; C08G 73/10; B29C 41/02; B29C 41/42; C09D 179/08; B29K 2079/08; B29L 2031/3475
See application file for complete search history.

(56) References Cited

U.S. PATENT DOCUMENTS

| | | | |
|---|---|---|---|
| 7,247,365 B2 | 7/2007 | Sato | |
| 9,388,278 B2 | 7/2016 | Lin et al. | |
| 9,966,260 B1 * | 5/2018 | Chan ................. | B23K 26/1224 |
| 10,212,821 B2 | 2/2019 | Huang et al. | |
| 10,334,738 B2 | 6/2019 | Huang et al. | |
| 2009/0104414 A1 * | 4/2009 | Furuta .................... | H05K 3/285 |
| | | | 525/431 |
| 2009/0139753 A1 | 6/2009 | Kim et al. | |
| 2013/0258479 A1 | 10/2013 | Okafuji et al. | |
| 2015/0210048 A1 | 7/2015 | Jeong et al. | |
| 2015/0232621 A1 | 8/2015 | Jeong et al. | |
| 2015/0239210 A1 | 8/2015 | Jeong et al. | |
| 2016/0172591 A1 * | 6/2016 | Kim ....................... | C08L 79/08 |
| | | | 428/473.5 |
| 2018/0334541 A1 | 11/2018 | Jeong et al. | |
| 2020/0062906 A1 | 2/2020 | Jeong et al. | |

FOREIGN PATENT DOCUMENTS

| | | |
|---|---|---|
| CN | 104379339 A | 2/2015 |
| CN | 104411487 A | 3/2015 |
| CN | 104487241 A | 4/2015 |
| CN | 108690495 A | 10/2018 |
| CN | 109890614 A | 6/2019 |
| EP | 2657729 A1 | 10/2013 |
| JP | 2003-001744 A | 1/2003 |
| JP | 2006-124686 A | 5/2006 |
| JP | 2006-231644 A | 9/2006 |
| JP | 2015-522451 A | 8/2015 |
| JP | 2016-120630 A | 7/2016 |
| JP | 2018-109773 A | 7/2018 |
| KR | 10-2007-0080222 A | 8/2007 |
| KR | 10-2012-0100274 A | 9/2012 |
| KR | 10-2014-0002704 A | 1/2014 |
| KR | 10-2014-0122205 A | 10/2014 |
| KR | 10-2015-0040200 A | 4/2015 |

(Continued)

OTHER PUBLICATIONS

Office Action issued for JP Appl. No. 2020-570120 on Mar. 14, 2023, with English translation, 5 pages.

(Continued)

*Primary Examiner* — Shane Fang
(74) *Attorney, Agent, or Firm* — ROTHWELL, FIGG, ERNST & MANBECK, P.C.

(57) ABSTRACT

According to the present invention, a stack comprises, between a carrier substrate and a flexible substrate layer, a peeling power adjustment layer comprising polyimide, which has a refractive index higher than that of the flexible substrate layer, so that a flexible substrate can be more easily peeled from a carrier substrate layer, and thus a flexible element can be manufactured without damage to the element through a simpler process.

7 Claims, No Drawings

(56) References Cited

FOREIGN PATENT DOCUMENTS

| KR | 10-2018-0016229 A | 2/2018 |
| KR | 10-2018-0016230 A | 2/2018 |
| KR | 10-1842447 B1 | 5/2018 |
| KR | 10-2018-0088185 A | 8/2018 |
| TW | 2015-09647 A | 3/2015 |
| WO | 2007-091807 A1 | 8/2007 |
| WO | 2015-152121 A1 | 10/2015 |
| WO | 2017-065319 A1 | 4/2017 |

OTHER PUBLICATIONS

International Search Report issued for International Application No. PCT/KR2019/015868 on Mar. 11, 2020, 6 pages.

* cited by examiner

STACK FOR MANUFACTURING FLEXIBLE ELEMENT AND METHOD FOR MANUFACTURING FLEXIBLE ELEMENT BY USING SAME

BACKGROUND OF THE INVENTION

1. Field of the Invention

This application is a 35 U.S.C. 371 National Phase Entry Application from PCT/KR2019/015868, filed on Nov. 19, 2019, designating the United States, which claims the benefits of priority to Korean Patent Application Nos. 10-2018-0143385, filed on Nov. 20, 2018 and 10-2019-0145547, filed on Nov. 14, 2019, the entire disclosures of which are incorporated herein by reference.

The present invention relates to a laminate structure having a peeling force adjusting layer capable of facilitating separation of a flexible substrate from a carrier substrate, and a method for manufacturing a flexible device using the same.

2. Background of the Invention

The display device market is rapidly changing its focus on flat panel displays (FPDs), which are large in size, thin, and lightweight. Such flat panel displays include a liquid crystal display (LCD), an organic light emitting display (OLED), or an electrophoresis device.

In particular, in recent years, in order to further expand the applications and uses of such flat panel displays, attention has been focused on a so-called flexible display device to which a flexible substrate is applied. The flexible display device is mainly considered to be applied to mobile devices such as smartphones, and the field of application is gradually expanded.

However, a process of forming and handling a display device structure such as TFTs on plastic (TOP) is an important key process in manufacturing a flexible display device. However, there are still many process problems in forming a device structure by directly replacing a flexible plastic substrate to the existing glass substrate in the manufacturing process of the device.

In particular, since a thin film glass included in the flexible substrate is easily broken by impact, the manufacturing process of the display substrate is performed with the thin glass on a carrier glass. Conventionally, after forming a sacrificial layer of a-silicon or the like on a carrier substrate such as a glass substrate, a flexible substrate is formed thereon. Thereafter, a device structure such as a thin film transistor is formed on the flexible substrate supported by the carrier substrate through the existing manufacturing process of the device on the glass substrate. Then, the sacrificial layer is destroyed by irradiating a carrier substrate or the like with laser or light to separate the flexible substrate on which the device structure is formed, and finally, a device having a flexible substrate such as a flexible display device is manufactured.

However, in the manufacturing process of the prior art, the device structure may be affected during irradiation of laser or light, so that defects may occur, and furthermore an equipment for laser or light irradiation and an additional process are required. As a result, the overall manufacturing process of the device becomes complicated and the manufacturing cost is also greatly increased.

In addition, since the adhesion between the sacrificial layer of a-Si, etc. and the flexible substrate is not sufficient, it is often necessary to form a separate adhesive layer between the sacrificial layer and the flexible substrate, which may complicate the overall process. In addition, since laser or light irradiation under more severe conditions is required, there is an increased concern that it may adversely affect the reliability of the device.

BRIEF SUMMARY OF THE INVENTION

The present invention provides a laminate structure for manufacturing a flexible device having a peeling force adjusting layer to help the separation from the flexible substrate layer.

In addition, the present invention provides a flexible device manufactured using the laminate structure.

In addition, the present invention provides a flexible display manufactured using the laminate structure.

Another aspect of the present invention is to provide a method for manufacturing a flexible device using the laminate structure.

The present invention provides a laminate structure for manufacturing a flexible device, comprising:
a carrier substrate;
a peeling force adjusting layer comprising polyimide and formed on the carrier substrate; and
a flexible substrate layer formed on the peeling force adjusting layer,
wherein the peeling force adjusting layer and the flexible substrate layer satisfy a Δn value defined by the following Equation 1 of 0.05 or more.

$$\Delta n = n_1 - n_2 \qquad \text{[Equation 1]}$$

wherein,
$n_1$ is an average value of a refractive index of TE (Transverse Electric) mode and a refractive index of TM (Transverse Magnetic) mode of the peeling force adjusting layer for light of 550 nm wavelength, and
$n_2$ is an average value of a refractive index of TE mode and a refractive index of TM mode of the flexible substrate layer for light of 550 nm wavelength.

According to one embodiment, the peeling force adjusting layer may contain polyimide that is produced by polymerizing at least one tetracarboxylic dianhydride having a structure of the formula 1 and at least one diamine having a structure of the formula 2.

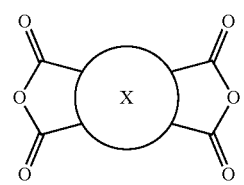

[Formula 1]

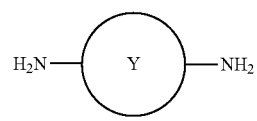

[Formula 2]

wherein,
X is a tetravalent organic group comprising aliphatic ring(s) or aromatic ring(s) in which each ring structure is a single ring structure, each ring is connected to each other by a single bond, or each ring is directly fused to each other to form a polycyclic structure, and Y is a divalent organic group comprising aromatic ring(s) or aliphatic ring(s) in which each ring structure is a single ring structure, each ring is connected to each other by a single bond, or each ring is directly fused to each other to form a polycyclic structure.

According to one embodiment, X may be selected from tetravalent organic groups of the formulas 3a to 3k.

(3a)

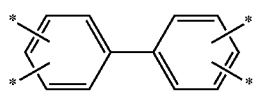
(3b)

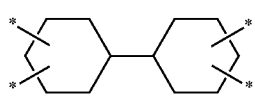
(3c)

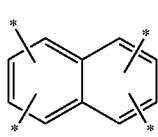
(3d)

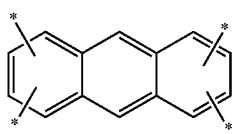
(3e)

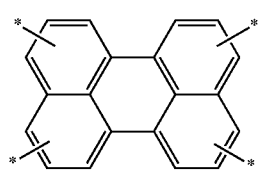
(3f)

(3g)

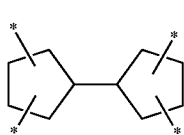
(3h)

(3i)

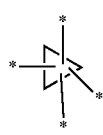
(3j)

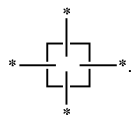
(3k)

The tetravalent organic groups of the formulas 3a to 3k are not substituted or one or more hydrogen atoms in the group are substituted with a substituent selected from the group consisting of an alkyl group having 1 to 10 carbon atoms, a fluoroalkyl group having 1 to 10 carbon atoms, an aryl group having 6 to 12 carbon atoms, a sulfonic acid group and a carboxylic acid group.

According to one embodiment, Y may be selected from divalent organic groups of the formulas 4a to 4k.

(4a)

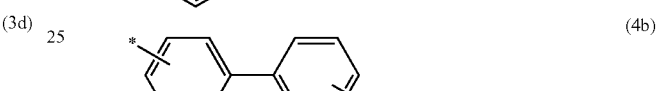
(4b)

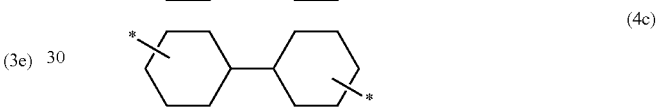
(4c)

(4d)

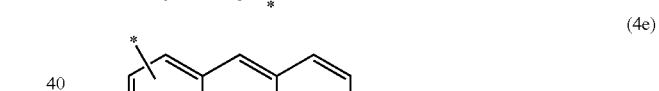
(4e)

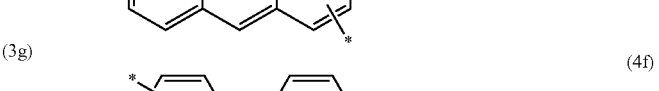
(4f)

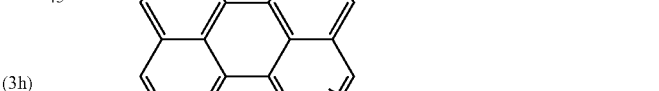
(4g)

(4h)

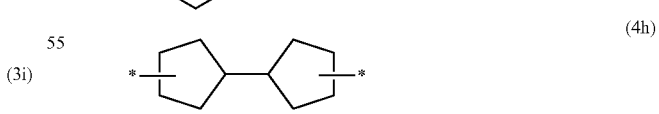
(4i)

(4j)

-continued

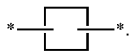
(4k)

The divalent organic group of the formulas 4a to 4k are not substituted or one or more hydrogen atoms in the group are substituted with a substituent selected from the group consisting of an alkyl group having 1 to 10 carbon atoms, a fluoroalkyl group having 1 to 10 carbon atoms, an aryl group having 6 to 12 carbon atoms, a sulfonic acid group and a carboxylic acid group.

According to one embodiment, the peeling force adjusting layer may comprise polyimide containing a repeating structure of the formula 5.

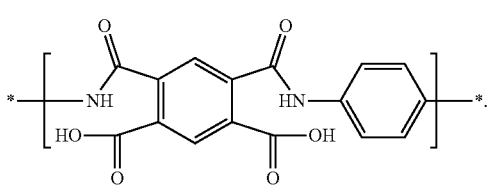
[Formula 5]

According to one embodiment, the total moles of dianhydride containing the tetracarboxylic dianhydride of the formula 1 may be less than the total moles of diamine containing the diamine of the formula 2. For example, the ratio of the total moles of the diamine to the total moles of the dianhydride may be 100:95~99.

According to one embodiment, the flexible substrate layer may contain polyimide.

According to one embodiment, the average value of the refractive index of TE mode and the refractive index of TM mode of the peeling force adjusting layer for light of 550 nm wavelength may be 1.65 to 1.75.

According to one embodiment, the average value of the refractive index of TE mode and the refractive index of TM mode of the flexible substrate layer for light of 550 nm wavelength may be 1.55 or more and less than 1.65.

According to one embodiment, the thickness of the peeling force adjusting layer may be 0.1 to 3.5 microns.

In addition, the present invention provides a method for manufacturing a flexible device using the laminate structure.

According to one embodiment, the method comprises the steps of:
coating a polyimide precursor composition for manufacturing a peeling force adjusting layer on a carrier substrate and then curing it at a temperature of 200 to 300° C. to form a peeling force adjusting layer;
coating and curing the composition for manufacturing a flexible substrate on the cured peeling force adjusting layer to form a flexible substrate layer;
forming a device on the flexible substrate layer; and
peeling the flexible substrate on which the device is formed from a carrier substrate on which the peeling force adjusting layer is formed,
wherein the peeling force adjusting layer and the flexible substrate layer satisfy a Δn value defined by the following Equation 1 of 0.05 or more.

$$\Delta n = n_1 - n_2$$ [Equation 1]

wherein,
$n_1$ is an average value of a refractive index of TE (Transverse Electric) mode and a refractive index of TM (Transverse Magnetic) mode of the peeling force adjusting layer for light of 550 nm wavelength, and
$n_2$ is an average value of a refractive index of TE mode and a refractive index of TM mode of the flexible substrate layer for light of 550 nm wavelength.

According to one embodiment, a peeling force when peeling the flexible substrate layer from the carrier substrate coated with the peeling force adjusting layer may be 0.1 N/cm or less.

According to one embodiment, the flexible device may be a flexible display device.

The laminate structure for manufacturing a flexible device according to the present invention comprises a carrier substrate, a flexible substrate layer and a peeling force adjusting layer disposed between the carrier substrate and the flexible substrate layer and comprising polyimide having a refractive index higher than that of the flexible substrate layer, thereby reducing the adhesion between the carrier substrate and the flexible substrate layer and facilitating peeling the flexible substrate layer from the carrier substrate. From this, the flexible substrate can be separated from the carrier substrate without damaging the device by a laser process.

DETAILED DESCRIPTION OF THE INVENTION

Since various modifications and variations can be made in the present invention, particular embodiments are illustrated and will be described in detail in the detailed description. It should be understood, however, that the invention is not intended to be limited to the particular embodiments, but includes all modifications, equivalents, and alternatives falling within the spirit and scope of the invention. In the following description of the present invention, detailed description of known functions will be omitted if it is determined that it may obscure the gist of the present invention.

In the present specification, when a part such as a layer, a film, a substrate, etc. is said to be 'above' or 'on' other part, it includes not only the case where it is 'just on' other part but also the case where another part is between thereof. Conversely, when a part such as a layer, a film, a substrate, etc. is said to be 'below' other part, it includes not only the case where it is 'just below' other part but also the case where another part is between thereof.

In the present specification, all compounds or organic groups may be substituted or un-substituted, unless otherwise specified. Herein, the term "substituted" means that at least one hydrogen contained in the compound or the organic group is substituted with a substituent selected from the group consisting of a halogen atom, an alkyl group or a halogenated alkyl group having 1 to 10 carbon atoms, a cycloalkyl group having 3 to 30 carbon atoms, an aryl group having 6 to 30 carbon atoms, a hydroxyl group, an alkoxy group having 1 to 10 carbon atoms, a carboxylic acid group, an aldehyde group, an epoxy group, a cyano group, a nitro group, an amino group, a sulfonic acid group or a derivative thereof.

In general, the flexible display is produced by coating and curing a polyimide solution on a support substrate to form a flexible substrate, forming a device on the flexible substrate, and then separating the flexible substrate on which the device is formed from the support substrate. The LLO (Laser Lift Off) process of peeling the flexible substrate by irradiating a laser to the flexible substrate via the support substrate is performed.

However, the laser equipment used in the LLO process is very expensive, it is difficult to maintain the equipment and high temperature may be generated instantaneously by high laser power during the peeling process so that it may affect the flexible substrate or device.

The present invention can provide a laminate structure comprising a peeling force adjusting layer that helps to easily peel off a flexible substrate from a carrier substrate, whereby the flexible substrate can be peeled off from the carrier substrate without using a laser.

The laminate structure for manufacturing a flexible device according to the present invention comprises:
a carrier substrate;
a peeling force adjusting layer comprising polyimide and formed on the carrier substrate; and
a flexible substrate layer formed on the peeling force adjusting layer,
wherein the peeling force adjusting layer and the flexible substrate layer satisfy a Δn value defined by the following Equation 1 of 0.05 or more.

$$\Delta n = n_1 - n_2 \quad \text{[Equation 1]}$$

wherein,
$n_1$ is an average value of a refractive index of TE (Transverse Electric) mode and a refractive index of TM (Transverse Magnetic) mode of the peeling force adjusting layer for light of 550 nm wavelength, and
$n_2$ is an average value of a refractive index of TE mode and a refractive index of TM mode of the flexible substrate layer for light of 550 nm wavelength.

In the present invention, the refractive index of transverse electric (TE) mode and the refractive index of transverse magnetic (TM) mode may be measured using light of 550 nm wavelength with a prism coupler.

According to the present invention, by providing a peeling force adjusting layer comprising polyimide between the carrier substrate and the flexible substrate layer, the flexible substrate on which the device is formed can be more easily peeled from the carrier substrate.

In particular, by using a polyimide having a refractive index higher than that of the flexible substrate layer as the peeling force adjusting layer, the peeling force to the flexible substrate can be reduced. For example, the peeling force adjusting layer comprising the polyimide having a high refractive index may prevent diffusion of the upper polyimide (debonding layer) used as the flexible substrate into the lower peeling force adjusting layer, thereby achieving a low peeling force. Herein, the peeling force means a force required to detach the flexible substrate layer from the carrier substrate, and the lower peeling force means the flexible substrate layer is detached with smaller force.

Specifically, the present invention controls the relationship between the refractive index of the flexible substrate layer and the refractive index of the peeling force adjusting layer in a range in which the Δn value defined by the Equation 1 is 0.05 or more, thereby efficiently adjusting the peeling force of the flexible substrate layer by the peeling force adjusting layer. The Δn value defined by the Equation 1 may be 0.05 or more, 0.06 or more, 0.07 or more, 0.075 or more, or 0.077 or more, and 0.1 or less, 0.09 or less, 0.08 or less, or 0.0785 or less.

According to one embodiment, the polyimide of the peeling force adjusting layer may have a rigid backbone, and molecular chains having such a rigid backbone can be easily packed so that they can exhibit a high refractive index.

The polyimide used as the peeling force adjusting layer may be prepared by, for example, reacting at least one tetracarboxylic dianhydride having a structure of the following formula 1 with at least one diamine having a structure of the following formula 2.

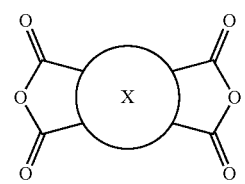

[Formula 1]

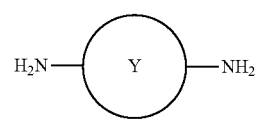

[Formula 2]

wherein, X may be a tetravalent organic group comprising aliphatic ring(s) having 3 to 24 carbon atoms or aromatic ring(s) having 6 to 30 carbon atoms, in particular a tetravalent organic group comprising aliphatic ring(s) or aromatic ring(s) in which each ring structure is a single ring structure, each ring is connected to each other by a single bond, or each ring is directly fused to each other to form a polycyclic structure, i.e., a rigid structure without any linking group. For example, tetravalent organic groups represented by the following formulas 3a to 3k may be mentioned, but are not limited thereto.

(3a)

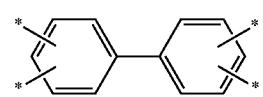

(3b)

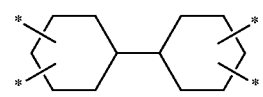

(3c)

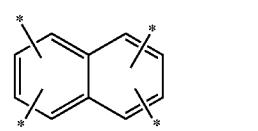

(3d)

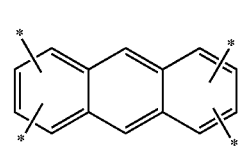

(3e)

-continued

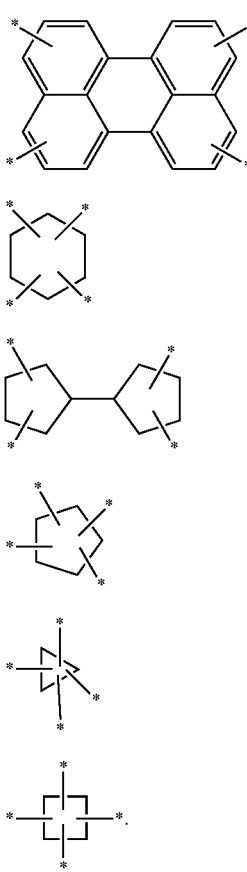

(3f)
(3g)
(3h)
(3i)
(3j)
(3k)

At least one hydrogen atom in the tetravalent organic groups of the formulas 3a to 3k may be substituted with a substituent selected from the group consisting of an alkyl group having 1 to 10 carbon atoms (e.g., methyl group, ethyl group, propyl group, isopropyl group, t-butyl group, pentyl group, hexyl group, etc.), a fluoroalkyl group having 1 to 10 carbon atoms (e.g., fluoromethyl group, perfluoroethyl group, trifluoromethyl group, etc.), an aryl group having 6 to 12 carbon atoms (e.g., phenyl group, naphthalenyl group, etc.), a sulfonic acid group and a carboxylic acid group.

Here, * indicated in the formula represents a binding site.

Y is a monocyclic or polycyclic aromatic divalent organic group having 6 to 24 carbon atoms, a monocyclic or polycyclic aliphatic divalent organic group having 6 to 18 carbon atoms, or a divalent organic group comprising aliphatic ring(s) or aromatic ring(s) in which each ring structure is a single ring structure, each ring is connected to each other by a single bond, or each ring is fused to each other to form a-polycyclic structure, i.e., a rigid structure without any linking group. For example, divalent organic groups represented by the following formulas 4a to 4k may be mentioned, but are not limited thereto.

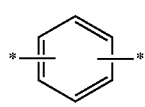

(4a)

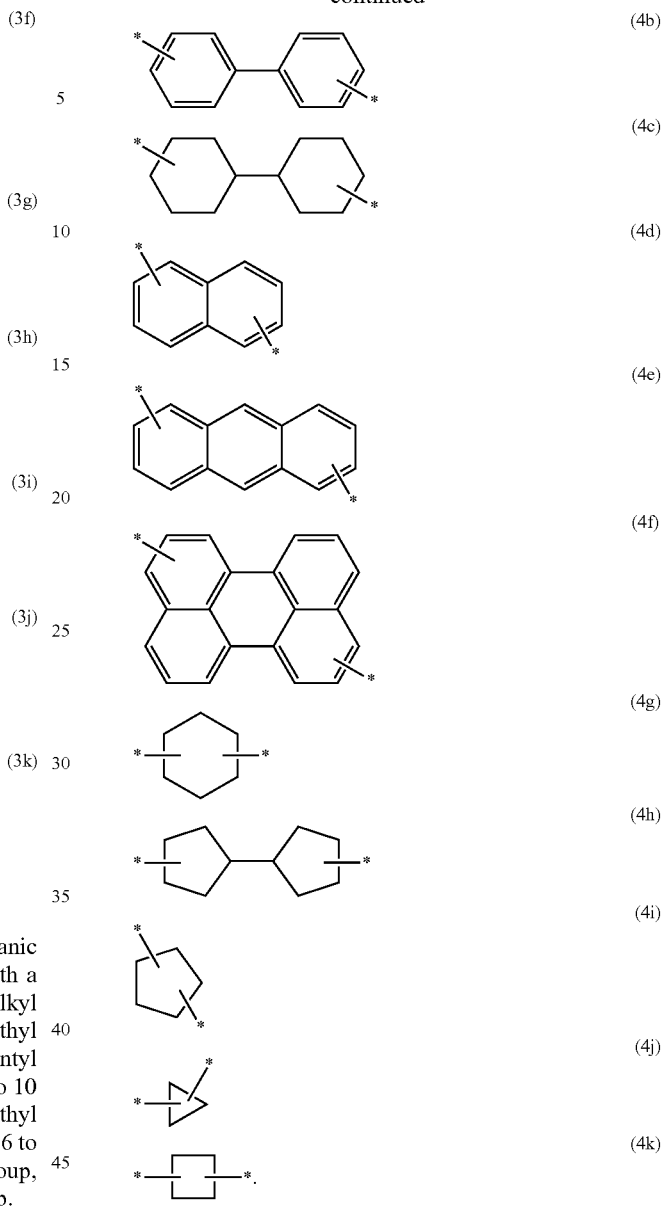

(4b)
(4c)
(4d)
(4e)
(4f)
(4g)
(4h)
(4i)
(4j)
(4k)

At least one hydrogen atom in the divalent organic groups of the formulas 4a to 4k may be substituted with a substituent selected from the group consisting of an alkyl group having 1 to 10 carbon atoms (e.g., methyl group, ethyl group, propyl group, isopropyl group, t-butyl group, pentyl group, hexyl group, etc.), a fluoroalkyl group having 1 to 10 carbon atoms (e.g., fluoromethyl group, perfluoroethyl group, trifluoromethyl group, etc.), an aryl group having 6 to 12 carbon atoms (e.g., phenyl group, naphthalenyl group, etc.), a sulfonic acid group and a carboxylic acid group.

According to one embodiment, the total molar amount of the diamine of formula 2 may be polymerized in excess relative to the total molar amount of the acid dianhydride having the structure of formula 1. For example, the total molar ratio of diamine to acid dianhydride may be 100:95~99, most preferably 100:96~97. When the molar ratio of diamine and acid dianhydride is an appropriate ratio, gelation of the polyamic acid solution can be suppressed to form a coating layer having a uniform surface, and it is easy to uniformly adjust the coating thickness to a certain thickness.

According to one embodiment, the polyimide included in the peeling force adjusting layer may contain a repeating structure of the following formula 5.

[Formula 5]

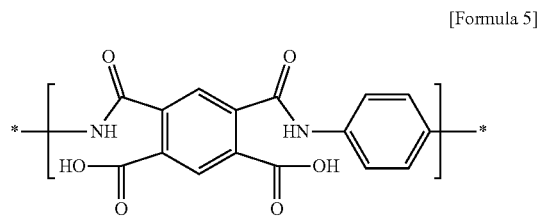

According to one embodiment, the refractive index of TE mode of the peeling force adjustment layer for the light of 550 nm wavelength may be 1.75 or more, 1.78 or more, 1.79 or more or 1.80 or more and 1.85 or less, 1.84 or less, 1.83 or less, 1.82 or less or 1.81 or less. The refractive index of TM mode may be 1.49 or more, 1.52 or more or 1.55 or more and 1.65 or less, 1.63 or less, 1.60 or less or 1.59 or less. The average of the refractive index of TE mode and the refractive index of TM mode may be 1.65 or more, 1.66 or more, 1.68 or more or 1.69 or more and 1.75 or less, 1.72 or less or 1.70 or less.

According to the present invention, a flexible device can be manufactured by a method comprising the steps of:
coating a polyimide precursor composition for manufacturing a peeling force adjusting layer on a carrier substrate and then curing it at a temperature of 200 to 300° C. to form a peeling force adjusting layer;
coating and curing the composition for manufacturing a flexible substrate on the peeling force adjusting layer to form a flexible substrate layer;
forming a device on the flexible substrate layer; and
peeling the flexible substrate on which the device is formed from a carrier substrate on which the peeling force adjusting layer is formed.

According to one embodiment, the peeling force adjusting layer may be coated on the carrier substrate with a thickness of 0.1 micron or more, 0.5 micron or more or 1 micron or more and 3.5 microns or less, 3 microns or less or 2 microns or less.

According to one embodiment, in peeling the flexible substrate layer from the carrier substrate on which the peeling force adjusting layer is formed, a peeling force may be 0.1 N/cm or less, 0.07 N/cm or less, 0.05 N/cm or less and 0.01 N/cm or more or 0.02 N/cm or more.

When the peeling strength is higher than 0.1 N/cm, the peeling of the flexible substrate layer may not be easy, or damage may occur to the device formed on the flexible substrate during the peeling process. Thus, it may be difficult to apply as the peeling force adjusting layer.

The peeling force adjusting layer and the flexible substrate layer may be separated by a physical stimulus, and the physical stimulus means peeling with only physical force without causing chemical change.

By providing a peeling force adjusting layer including the polyimide resin according to the present invention between the carrier substrate and the flexible substrate to be applied as a substrate of a flexible display device, the flexible substrate can be easily separated from the peeling force adjusting layer even if the laser or light irradiation process is omitted and only a physical stimulus is applied, so that a device having a flexible substrate such as a flexible display device can be easily manufactured. This is because the polyimide having a high refractive index is used as the peeling force adjusting layer, thereby preventing the polymer of the flexible substrate layer disposed on the peeling force adjusting layer, for example, polyimide, from diffusing into the peeling force adjusting layer to reduce the peeling force.

As the flexible substrate, any polymer known to be applicable to a substrate of a flexible device may be included without particular limitation. Specific examples thereof may include at least one selected from the group consisting of polyether sulfone, polyethylene naphthalate, polyethylene terephthalate, polycarbonate, polyimide, polyetherimide, polyamideimide, polyester, polyether amide imide, polyester amide imide, and polyarylate, more preferably a polyimide-based resin and the type of polyimide is not particularly limited.

According to one embodiment, the refractive index of TE mode of the polymer resin contained in the flexible substrate layer may be 1.65 or more, 1.67 or more and 1.70 or less, 1.69 or less, 1.68 or less or 1.672 or less. The refractive index of TM mode may be 1.50 or more, 1.54 or more or 1.55 or more and 1.60 or less, 1.58 or less, or 1.57 or less. The average of the refractive index of TE mode and the refractive index of TM mode may be 1.55 or more, 1.58 or more or 1.60 or more and less than 1.65 or 1.64 or less, 1.63 or less, or 1.62 or less.

The polymerization reaction of the acid dianhydride and the diamine compound for producing the polyimide for the debonding layer and the flexible substrate layer can be carried out according to a conventional polymerization method of a polyimide or a precursor thereof, such as solution polymerization.

The reaction may be carried out under anhydrous conditions and the reaction temperature during the polymerization reaction may be −75 to 50° C., preferably 0 to 40° C. The reaction may be carried out by adding the acid dianhydride with the diamine compound dissolved in an organic solvent.

In addition, the organic solvent that can be used in the polymerization reaction may be, in particular, selected from the group consisting of ketones such as γ-butyrolactone, 1,3-dimethyl-imidazolidinone, methyl ethyl ketone, cyclohexanone, cyclopentanone and 4-hydroxy-4-methyl-2-pentanone; aromatic hydrocarbons such as toluene, xylene and tetramethylbenzene; glycol ethers (Cellosolve) such as ethylene glycol monoethyl ether, ethylene glycol monomethyl ether, ethylene glycol monobutyl ether, diethylene glycol monoethyl ether, diethylene glycol monomethyl ether, diethylene glycol monobutyl ether, propylene glycol monomethyl ether, propylene glycol monoethyl ether, dipropylene glycol diethyl ether and triethylene glycol monoethyl ether; ethyl acetate, butyl acetate, ethylene glycol monoethyl ether acetate, ethylene glycol monobutyl ether acetate, diethylene glycol monoethyl ether acetate, dipropylene glycol monomethyl ether acetate, ethanol, propanol, ethylene glycol, propylene glycol, carbitol, dimethylacetamide (DMAc), N,N-diethylacetamide (DEAc), dimethylformamide (DMF), diethylformamide (DEF), N-methylpyrrolidone (NMP), N-ethylpyrrolidone (NEP), N-vinylpyrrolidone 1,3-dimethyl-2-imidazolidinone, N,N-dimethylmethoxyacetamide, dimethyl sulfoxide, pyridine, dimethyl sulfone, hexamethylphosphoramide, tetramethylurea, N-methylcaprolactam, tetrahydrofuran, m-dioxane, p-dioxane, 1,2-dimethoxyethane, bis(2-methoxyethyl)ether, 1,2-bis(2-methoxyethoxy)ethane, bis[2-(2-methoxyethoxy)]ether, and a mixture thereof.

In addition, in the case of synthesizing polyamic acid or polyimide, an end-capping agent may be further added in which the terminal of the molecule reacts with dicarboxylic acid anhydride or monoamine to end-cap the terminal of the polyimide in order to inactivate excess polyamino groups or acid anhydride groups.

The method for producing a polyimide using the prepared polyimide precursor composition includes applying the polyimide precursor composition to one surface of a substrate and imidizing and curing it.

Specifically, the polyimide precursor composition may be in the form of a solution dissolved in the organic solvent, and in the case of having such a form, for example, when the polyimide precursor is synthesized in the organic solvent, the polyimide precursor composition may be a polyimide precursor solution itself as obtained after polymerization or with added by the same solution additionally, or may be obtained by diluting the polyimide precursor solution obtained after polymerization with another solvent.

The polyimide precursor composition may include solids in an amount such that the polyimide precursor composition has an appropriate viscosity in consideration of processability such as coating property in the film-forming process, and the solid content may be 5 to 20% by weight based on the total weight of the polyimide precursor composition. Alternatively, the polyimide precursor composition may preferably be adjusted to have a viscosity of 400 to 50,000 cP. The viscosity of the polyimide precursor composition may be less than 400 cP. When the viscosity of the polyimide precursor composition is greater than 50,000 cP, fluidity may be lowered during manufacturing of the display substrate using the polyimide precursor composition, which may cause problems in the manufacturing process, such as uneven coating.

As the carrier substrate, a glass substrate, a metal substrate, a plastic substrate, or the like can be used without any particular limitation. Among them, a glass substrate may be preferable which is excellent in thermal and chemical stabilities during imidization and curing processes for the polyimide precursor and can be easily separated even without any treatment with additional release agent while not damaging the polyimide film formed after curing.

The applying or coating process may be carried out according to a conventional application method. Specifically, a spin coating method, a bar coating method, a roll coating method, an air knife method, a gravure method, a reverse roll method, a kiss roll method, a doctor blade method, a spray method, a dipping method, a brushing method, or the like may be used. Among these, it is more preferable to carry out by a casting method which allows a continuous process and enables to increase an imidization rate of polyimide resin.

In addition, the polyimide precursor solution may be applied on the substrate in the thickness range such that the polyimide film to be finally produced has a thickness suitable for a peeling force adjusting layer or a display substrate. For example, the thickness of the flexible substrate layer may be at least 5 microns, at least 10 microns, at least 12 microns or at least 15 microns and at most 30 microns, or at most 20 microns.

After the application of the polyimide precursor composition, a drying process for removing the solvent remained in the polyimide precursor composition may be further optionally performed prior to the curing process.

The drying process may be carried out according to a conventional method. Specifically, the drying process may be carried out at a temperature of 140° C. or lower, or from 80° C. to 140° C. If the drying temperature is lower than 80° C., the drying process becomes longer. If the drying temperature exceeds 140° C., the imidization may proceed rapidly, making it difficult to form a polyimide film having a uniform thickness.

The curing process of the peeling force adjusting layer may be carried out by heat treatment at a temperature of 200 to 300° C.

Subsequently, the curing process of polyimide contained in the flexible substrate layer may be performed by heat treatment at a temperature of 300° C. to 400° C. The curing process may be performed in a multi-step heating process within the above-described temperature range. In addition, the curing time in the curing process is not particularly limited, for example for 3 to 30 minutes.

In addition, after the curing process in forming the peeling force adjusting layer, a subsequent heat treatment process may be optionally further performed to increase imidization rate of the polyimide resin in the polyimide film to form a polyimide film having the above-described physical properties.

The subsequent heat treatment process is preferably carried out for 1 minute to 30 minutes at 200° C. or more, or 200° C. to 450° C. In addition, the subsequent heat treatment process may be performed once or may be performed in multiple stages two or more times. Specifically, it may be performed in three steps including a first heat treatment at 200 to 220° C., a second heat treatment at 300° C. to 380° C., and a third heat treatment at 400° C. to 450° C.

The polyimide included in the flexible substrate layer may have a glass transition temperature of about 330° C. or more. Since it has such excellent heat resistance, the film containing the polyimide can maintain excellent heat resistance and mechanical property with respect to the high temperature heat applied during the manufacturing process of the device.

The laminate structure according to the present invention can be particularly useful for the manufacture of flexible devices in electronic devices such as OLEDs or LCDs, electronic paper, solar cells.

Hereinafter, embodiments of the present invention will be described in detail so that those skilled in the art can easily carry out the present invention. The present invention may, however, be embodied in many different forms and should not be construed as limited to the embodiments set forth herein.

Example 1

0.095 mol of PDA (p-phenylenediamine) was dissolved in 100 g of DEAc (N,N-diethylacetamide) under nitrogen atmosphere, and then 0.0917 mol of PMDA (pyromellitic dianhydride) and 80 g of DEAc as an additional solvent were added and reacted for 48 hours to prepare a polyamic acid solution. The polyamic acid solution was diluted to an appropriate concentration, coated with a thickness of 1 micron on a glass substrate, and cured at 250° C. to prepare a peeling force adjusting layer.

For formation of a flexible substrate layer, 0.0666 mol of TFMB (2,2'-bis(trifluoromethyl)-4,4'-diamino biphenyl) was dissolved in 70 g of DEAc, and then 0.033 mol of PMDA and 0.033 mol of BPDA and 150 g of DEAc as an additional solvent were added and reacted for 48 hours to prepare a polyamic acid solution. The polyamic acid solution (TFMB-PMDA/BPDA) was coated with a thickness of 15 microns on the peeling force adjusting layer, and cured at 300° C. to prepare a laminate structure having a flexible substrate layer formed.

Comparative Example 1

0.0666 mol of TFMB (2,2'-Bis(trifluoromethyl)-4,4'-diamino biphenyl) was dissolved in 70 g of DEAc under nitrogen atmosphere, and then 0.033 mol of PMDA and 0.033 mol of BPDA and 150 g of DEAc as an additional solvent were added and reacted for 48 hours to prepare a polyamic acid solution.

The polyamic acid solution was coated with a thickness of 1 micron on a glass substrate, and cured at 250° C. to prepare a peeling force adjusting layer. Then, the same polyamic acid solution was coated with a thickness of 15 microns on the peeling force adjusting layer, and cured at 300° C. to prepare a laminate structure having a flexible substrate layer formed.

Examples 2 to 4

A laminate structure was prepared in the same manner as in Example 1, except that the molar ratio of acid dianhydride and diamine was adjusted as shown in Table 1.

Experimental Example 1

<Measurement of Refractive Index>

The refractive indices of TE (Transverse Electric) mode and TM (Transverse Magnetic) mode for the light of 550 nm wavelength of the polyimide in the peeling force adjusting layer and the flexible substrate layer were measured using a Metricon 2010M Prism Coupler.

The Δn value of Equation 1 is calculated based on the measured refractive index and is shown in Table 1 below.

$$\Delta n = n_1 - n_2 \quad \text{[Equation 1]}$$

wherein, $n_1$ is an average value of a refractive index of TE (Transverse Electric) mode and a refractive index of TM (Transverse Magnetic) mode of the peeling force adjusting layer for light of 550 nm wavelength, and $n_2$ is an average value of a refractive index of TE mode and a refractive index of TM mode of the flexible substrate layer for light of 550 nm wavelength.

<Measurement of Peeling Force>

The laminate structure was cut to a rectangular shape having a width of 10 mm and a length of 100 mm and the force of peeling the cut flexible substrate at 50 mm/min with holding the end of the flexible substrate was measured by using Texture Analyzer (TA, XT plus, Stable microsystems).

The measurement results of the refractive index and the peeling force are shown in Table 1.

TABLE 1

| | Peeling force adjusting layer monomer equivalent ratio | | Peeling force adjusting layer Refractive index | | | Flexible substrate Refractive index | | | | Peeling force |
|---|---|---|---|---|---|---|---|---|---|---|
| | PMDA | PDA | TE | TM | Avg. | TE | TM | Avg. | Δn | (N/cm) |
| Ex. 1 | 97 | 100 | 1.8061 | 1.5826 | 1.6944 | 1.6716 | 1.5603 | 1.6160 | 0.0784 | 0.037 |
| Ex. 2 | 96 | 100 | 1.8053 | 1.5851 | 1.6952 | 1.6718 | 1.5643 | 1.6181 | 0.0771 | 0.046 |
| Ex. 3 | 99 | 100 | 1.8074 | 1.5831 | 1.6953 | 1.6721 | 1.5613 | 1.6167 | 0.0786 | 0.066 |
| Ex. 4 | 95 | 100 | 1.8012 | 1.5613 | 1.6813 | 1.6732 | 1.5623 | 1.6178 | 0.0635 | 0.082 |
| Comp. Ex.1 | PMDA/BPDA (49.55/49.55) | TFMB (100) | 1.6745 | 1.5630 | 1.6188 | 1.6734 | 1.5613 | 1.6174 | 0.0014 | 0.333 |

From the above results, in the case of Examples 1 and 2 in which the Δn value calculated from the refractive indices of the peeling force adjusting layer and the flexible substrate satisfies 0.05 or more, the peeling force was decreased to the level of 1/10 of that of Comparative Example 1. In addition, in Examples 3 and 4, peeling force of 0.1 N/cm or less which is much lower than that of Comparative Example 1 was obtained.

From this, it can be seen that in the case of using the peeling force adjusting layer according to the present invention, the flexible device can be manufactured more easily in the actual process.

However, in Example 3, the surface of the peeling force adjusting layer was somewhat uneven because gelation of the solution for forming the peeling force adjusting layer occurred, and in Example 4, the viscosity of the solution for forming the peeling force adjusting layer was low so that there was a difficulty in forming the thickness of the peeling force adjusting layer appropriately. Therefore, for example, when manufacturing a peeling force adjusting layer using PDA and PMDA, the most preferable molar ratio may be 100:96-97.

While the present invention has been particularly shown and described with reference to specific embodiments thereof, it will be apparent to those skilled in the art that this specific description is merely a preferred embodiment and that the scope of the invention is not limited thereby. It is therefore intended that the scope of the invention be defined by the claims appended hereto and their equivalents.

What is claimed is:

1. A laminate structure for manufacturing a flexible device, comprising:

a carrier substrate;

a peeling force adjusting layer comprising a polyimide and formed on the carrier substrate; and a flexible substrate layer formed on the peeling force adjusting layer, wherein the peeling force adjusting layer and the flexible substrate layer satisfy a Δn value defined by the following Equation 1 of at least 0.05:

$$\Delta n = n_1 - n_2 \quad \text{[Equation 1]}$$

wherein, $n_1$ is an average value of a refractive index of TE (Transverse Electric) mode and a refractive index of TM (Transverse Magnetic) mode of the peeling force adjusting layer for light of 550 nm wavelength, and $n_2$ is an average value of a refractive index of TE mode and a refractive index of TM mode of the flexible substrate layer for light of 550 nm wavelength, wherein the average value of the refractive index of TE mode and the refractive index of TM mode of the flexible substrate layer for light of 550 nm wavelength is 1.55 or more and less than 1.65, wherein the polyimide contained in the peeling force adjusting layer is a polymerization product of pyromellitic dianhydride and p-phenylenediamine, wherein a ratio of the total moles of the p-phenylenediamine to the total moles of the pyromellitic dianhydride in the peeling force adjusting layer is 100: 96-97, wherein the polyimide contained in the peeling force adjusting layer is an imidized product of a polyamic acid containing a repeating structure of the following formula 5:

[Formula 5]

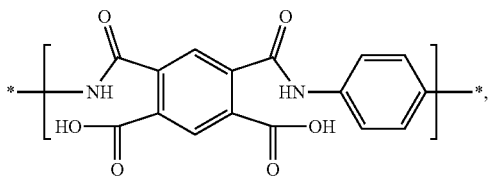

and wherein the flexible substrate layer comprises a polyimide that is a polymerization product of 2,2'-bis(trifluoromethyl)-4,4'-diamino biphenyl with pyromellitic dianhydride and 3,3',4,4'-biphenyltetracarboxylic dianhydride, and wherein a value of the peeling force of the peeling force adjusting layer is about 0.03 to about 0.05 N/cm.

2. The laminate structure for manufacturing a flexible device according to claim 1, wherein the average value of the refractive index of TE mode and the refractive index of TM mode of the peeling force adjusting layer for light of 550 nm wavelength is 1.65 to 1.75.

3. The laminate structure for manufacturing a flexible device according to claim 1, wherein a thickness of the peeling force adjusting layer is 0.1 to 3.5 microns.

4. A flexible device comprising the laminate structure according to claim 1.

5. A method for manufacturing a flexible device comprising the steps of:
coating a polyimide precursor composition for manufacturing a peeling force adjusting layer on a carrier substrate and then curing the composition at a temperature of 200 to 300° C. to form the peeling force adjusting layer;
coating and curing a composition for manufacturing a flexible substrate layer on the peeling force adjusting layer to form the flexible substrate layer;
forming a device on the flexible substrate layer; and
peeling the flexible substrate layer on which the device is formed from the carrier substrate on which the peeling force adjusting layer is formed,
wherein the peeling force adjusting layer and the flexible substrate layer satisfy a Δn value defined by the following Equation 1 of at least 0.05:

$$\Delta n = n_1 - n_2 \quad \text{[Equation 1]}$$

wherein,
$n_1$ is an average value of a refractive index of TE (Transverse Electric) mode and a refractive index of TM (Transverse Magnetic) mode of the peeling force adjusting layer for light of 550 nm wavelength, and
$n_2$ is an average value of a refractive index of TE mode and a refractive index of TM mode of the flexible substrate layer for light of 550 nm wavelength,
wherein the average value of the refractive index of TE mode and the refractive index of TM mode of the flexible substrate layer for light of 550 nm wavelength is 1.55 or more and less than 1.65,
wherein the polyimide contained in the peeling force adjusting layer is a polymerization product of pyromellitic dianhydride and p-phenylenediamine,
wherein a ratio of the total moles of the p-phenylenediamine to the total moles of the pyromellitic dianhydride in the peeling force adjusting layer is 100:96-97,
wherein the polyimide contained in the peeling force adjusting layer is prepared by a polyamic acid containing a repeating structure of the following formula 5:

[Formula 5]

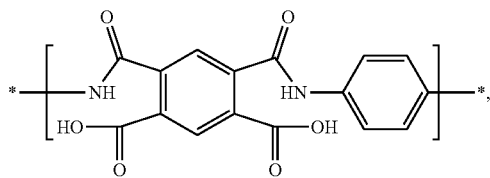

and wherein the flexible substrate layer contained a polyimide that is produced by polymerizing 2,2'-bis(trifluoromethyl)-4,4'-diamino biphenyl with pyromellitic dianhydride and 3,3',4,4'-biphenyltetracarboxylic dianhydride, and wherein a value of the peeling force of the peeling force adjusting layer is about 0.03 to about 0.05 N/cm.

6. The method for manufacturing a flexible device according to claim 5, wherein a peeling force when peeling the flexible substrate layer from the carrier substrate coated with the peeling force adjusting layer is 0.1 N/cm or less.

7. The method for manufacturing a flexible device according to claim 5, wherein the flexible device is a flexible display device.

* * * * *